US011221656B2

(12) United States Patent
Sethi et al.

(10) Patent No.: US 11,221,656 B2
(45) Date of Patent: Jan. 11, 2022

(54) METHOD AND APPARATUS FOR SELECTIVE FAN CONTROL IN AN INFORMATION HANDLING SYSTEM

(71) Applicant: DELL PRODUCTS, LP, Round Rock, TX (US)

(72) Inventors: Parminder Singh Sethi, Ludhian (IN); Madhuri Dwarakanath, Bangalore (IN); Selvaraja Subburaja, Ramanathapuram (IN)

(73) Assignee: Dell Products L.P., Round Rock, TX (US)

( * ) Notice: Subject to any disclaimer, the term of this patent is extended or adjusted under 35 U.S.C. 154(b) by 77 days.

(21) Appl. No.: 16/671,887

(22) Filed: Nov. 1, 2019

(65) Prior Publication Data

US 2021/0132671 A1    May 6, 2021

(51) Int. Cl.
*H05K 7/20*    (2006.01)
*G06F 1/20*    (2006.01)
*G01K 13/00*    (2021.01)
*G05B 15/02*    (2006.01)

(52) U.S. Cl.
CPC ............ *G06F 1/206* (2013.01); *G01K 13/00* (2013.01); *G05B 15/02* (2013.01); *H05K 7/20209* (2013.01); *G06F 2200/201* (2013.01)

(58) Field of Classification Search
CPC ................................................ H05K 7/20209
USPC ........................................................ 700/300
See application file for complete search history.

(56) References Cited

U.S. PATENT DOCUMENTS

| 7,098,617 | B1* | 8/2006 | Oljaca ...................... G06F 1/206 318/268 |
|---|---|---|---|
| 2012/0268890 | A1* | 10/2012 | Stock ................ H05K 7/20145 361/679.53 |
| 2013/0226364 | A1* | 8/2013 | Artman ................... G06F 1/203 700/300 |
| 2015/0098180 | A1* | 4/2015 | Berghe ...................... G06F 1/20 361/679.48 |
| 2017/0351448 | A1* | 12/2017 | Brown ................ G06F 11/1441 |
| 2018/0267566 | A1* | 9/2018 | Locke ................ G05D 23/1919 |
| 2019/0086881 | A1* | 3/2019 | Norton ................... G05B 15/02 |
| 2019/0361508 | A1* | 11/2019 | Yarragunta ........... F04D 27/004 |
| 2020/0033919 | A1* | 1/2020 | Dan ........................ G05B 15/02 |

* cited by examiner

*Primary Examiner* — Suresh Suryawanshi
(74) *Attorney, Agent, or Firm* — Larson Newman, LLP

(57) ABSTRACT

An information handling system (IHS) includes spatially diverse IHS components and temperature sensors disposed with respect to the spatially diverse IHS components. A fan controller defines cooling sections of the IHS for spatially diverse fans based on topological information as to locations of the spatially diverse IHS components, and selectively controls the spatially diverse fans according to component temperatures obtained from the temperature sensors and according to the cooling sections.

19 Claims, 4 Drawing Sheets

METHOD AND APPARATUS FOR SELECTIVE FAN CONTROL IN AN INFORMATION HANDLING SYSTEM

FIELD OF THE DISCLOSURE

The present disclosure generally relates to information handling systems, and more particularly relates to selective fan control in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system (IHS) includes spatially diverse IHS components and temperature sensors disposed with respect to the spatially diverse IHS components. A fan controller defines cooling sections of the IHS for spatially diverse fans based on topological information as to locations of the spatially diverse IHS components. The fan controller may selectively control the spatially diverse fans according to component temperatures obtained from the temperature sensors and according to the cooling sections.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
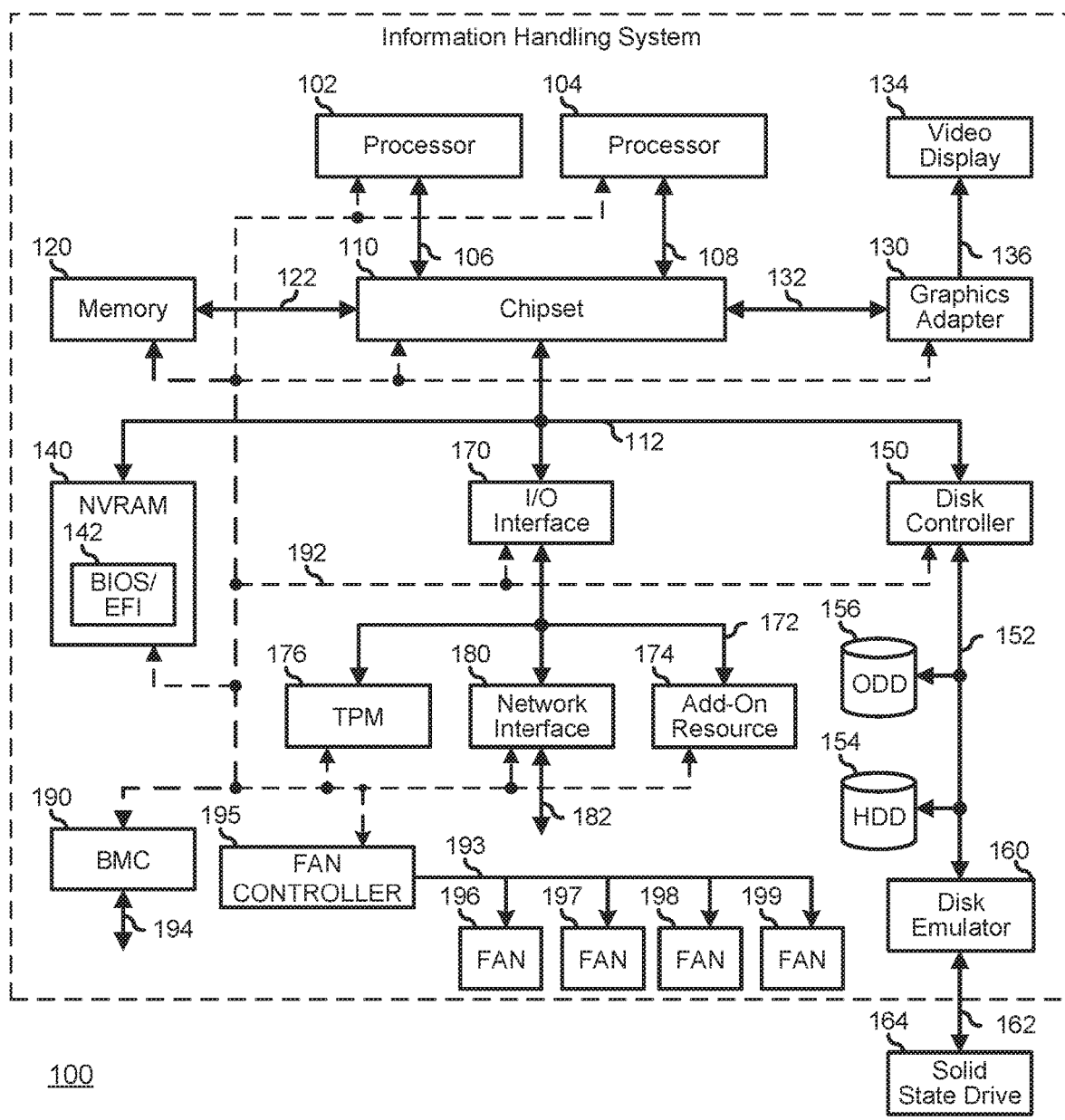
FIG. 1 is a block diagram illustrating an information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics adapter 130, include a basic input and output system/extensible firmware interface (BIOS/EFI) module 140, a disk controller 150, a disk emulator 160, an input/output (I/O) interface 170, a network interface 180, a baseboard management controller (BMC) 190, a fan controller 195, and fans 196, 197, 198, and 199. Processor 102 is connected to chipset 110 via processor interface 106, and processor 104 is connected to chipset 110 via processor interface 108. Memory 120 is connected to chipset 110 via a memory bus 122. Graphics adapter 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a Serial Peripheral Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

BMC 190 is connected by a management interface 192 to a plurality of system components, such as processor 102, processor 104, memory 120, chipset 110, graphics adapter 130, I/O interface 170, disk controller 150, NVRAM module 140, TPM 176, network interface 180, add-on resource 174, and fan controller 195. BMC 190 is connected to an external management interface 194 for platform management by an external IHS. Fan controller 195 is connected to fans 196, 197, 198, and 199 via a connection 193, which may be a common connection or a plurality of separate connections.

Figure 2:
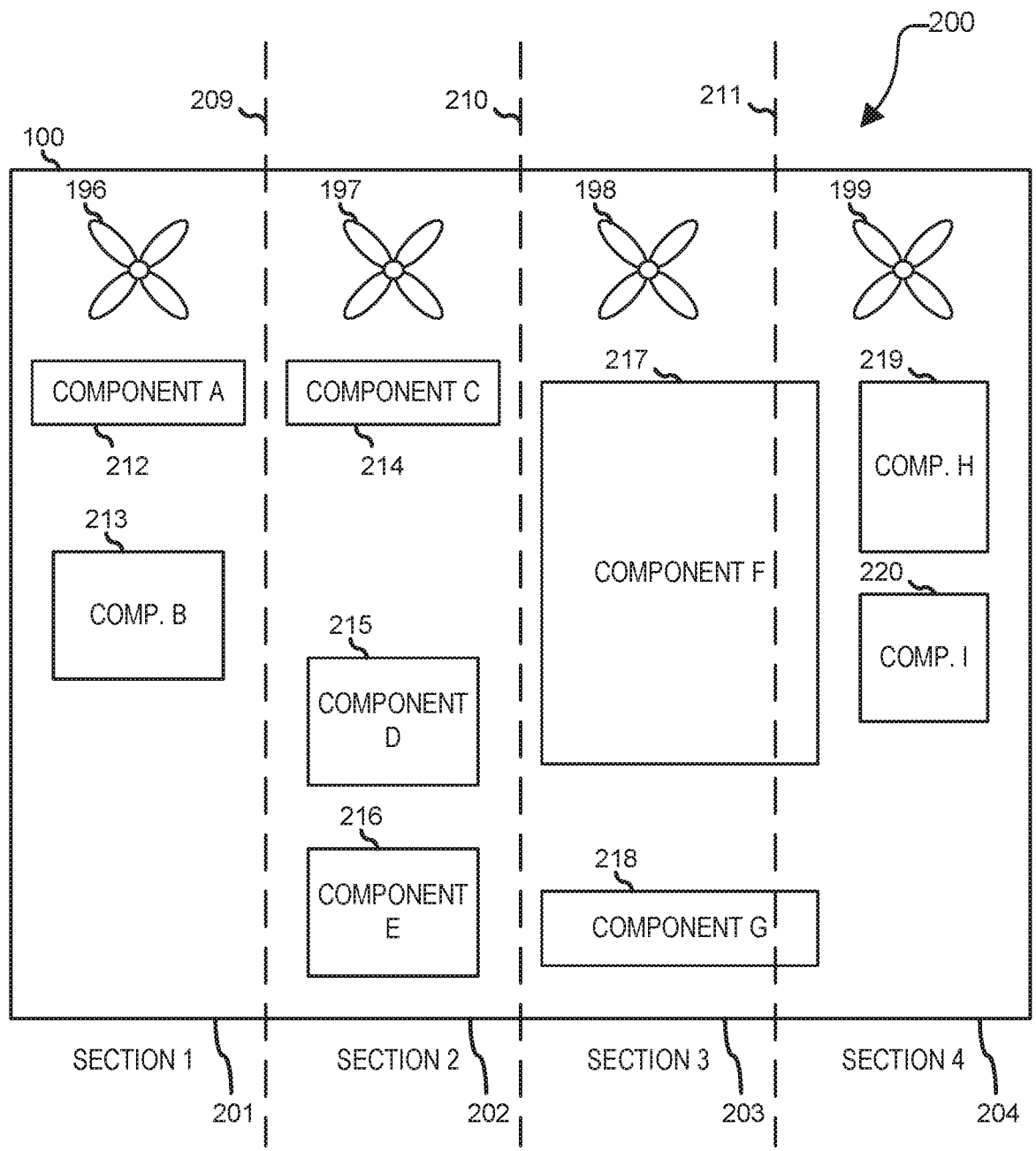
FIG. 2 is a schematic diagram illustrating virtual division of an IHS into a plurality of sections for control of a plurality of fans in accordance with at least one embodiment.

FIG. 2 shows an apparatus 200 that includes IHS 100. Components within IHS 100, examples of which are shown in FIG. 1, are generalized in FIG. 2 as component A 212, component B 213, component C 214, component D 215, component E 216, component F 217, component G 218, component H 219, and component I 220, which are shown topologically with respect to IHS 100 (such as in their respective locations on a circuit board of IHS 100). Fans 196, 197, 198, and 199 are shown at spatially diverse locations within IHS 100. Based on the interaction of each of fans 196, 197, 198, and 199 in cooling components A-I 212-220, apparatus 200 is divided into section 1 201, section 2 202, section 3 203, and section 4 204, along dashed lines 209, 210, and 211 representing section boundaries. As shown, section boundary 209 provides demarcation between section 1 201 and section 2 202, section boundary 210 provides demarcation between section 2 202 and section 3 203, section boundary 211 provides demarcation between section 3 203 and section 4 204.

Figure 3:
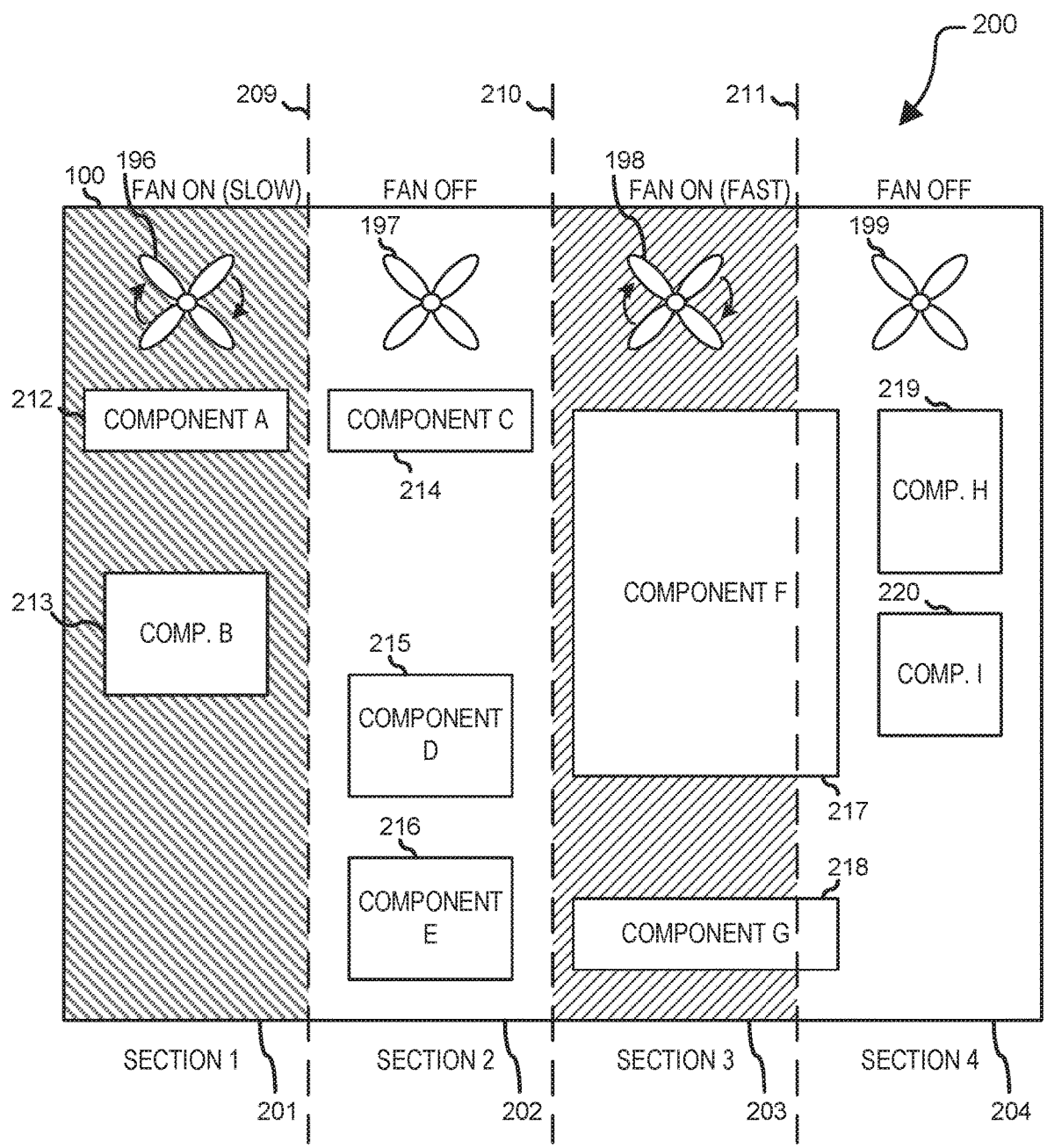
FIG. 3 is a schematic diagram illustrating control of a plurality of fans of an IHS according to a plurality of sections in accordance with at least one embodiment.

FIG. 3 shows the apparatus 200 of FIG. 2 with selective fan control responsive to temperature measurements taken from IHS components. Section 1 201 is filled with shading with lines descending from left to right to indicate a temperature measurement corresponding to section 1 201 is somewhat elevated (such as warm). Section 3 203 is filled with shading with lines ascending from left to right to indicate a temperature measurement corresponding to section 2 203 is elevated (such as hot). Sections 2 202 and 4 204 are not filled with shading, indicating that temperature measurements of those sections are not elevated (such as cool). As the temperature of section 1 201 is somewhat elevated (such as warm), fan controller 195 selectively controls fan 196 to be powered on to provide cooling to section 1 201. As the temperature of section 3 203 is elevated (such as hot), fan controller 195 selectively controls fan 198 to be powered on to provide cooling to section 3 203. As the temperatures of sections 2 202 and 4 204 are not elevated (such as cool), fan controller 195 selectively controls fans 197 and 199 to be powered off, as cooling to sections 2 202 and 4 204 is not needed.

Figure 4:
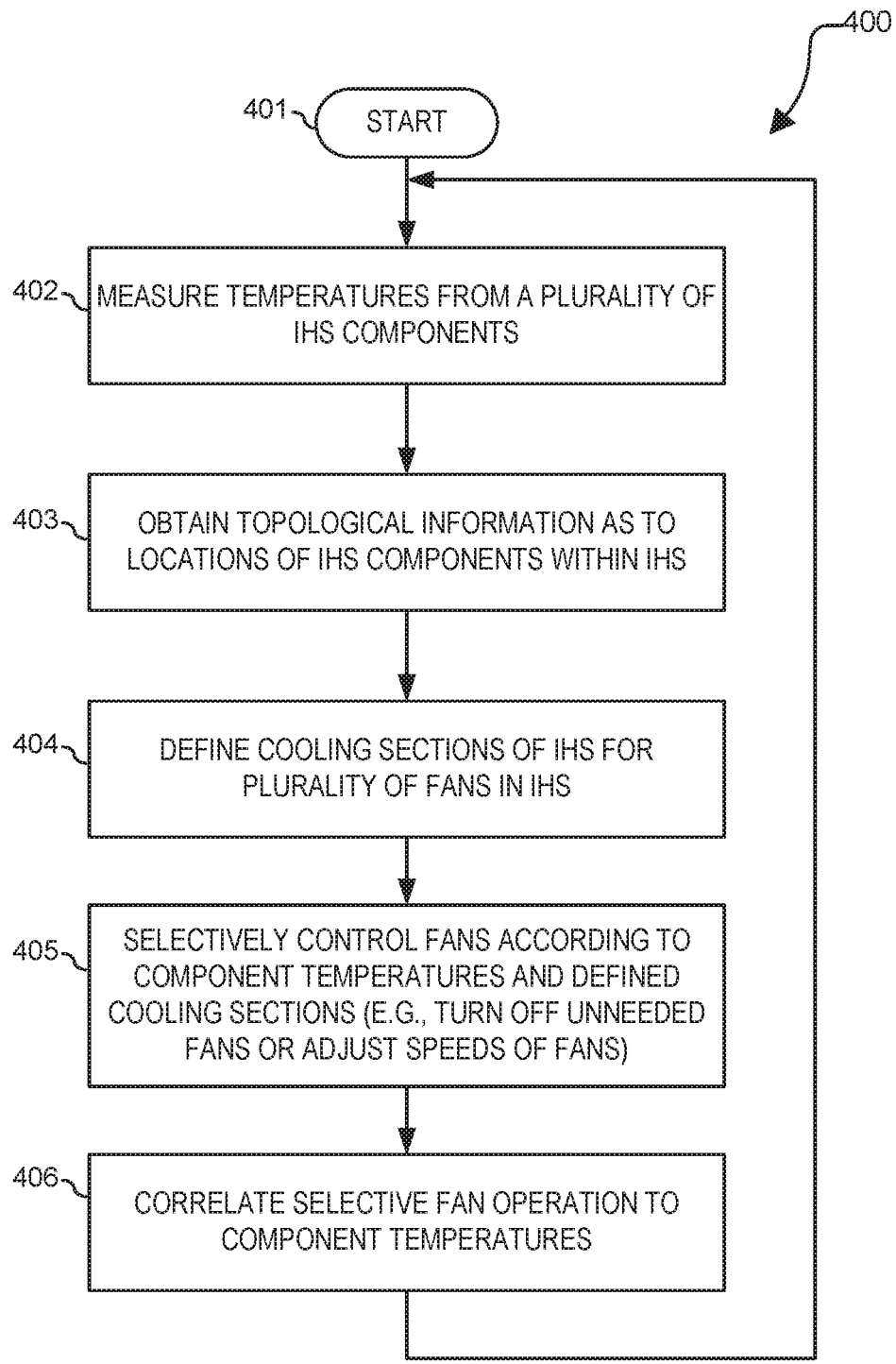
FIG. 4 is a flow diagram illustrating a method for control of a plurality of fans of an IHS according to a plurality of sections in accordance with at least one embodiment.

In accordance with at least one embodiment, a fan is selectively controlled to be fully powered on or fully powered off. In accordance with at least one embodiment, a fan is selectively controlled, when powered on, to operate at a variable speed, ranging from greater than zero speed up to a full speed that can be as high as the maximum rated speed of the fan. The variable speed can be, for example, continuously variable or, as another example, incrementally variable at a number of incremental speeds. As an example with respect to FIG. 3, as the temperature of section 1 201 is somewhat elevated (such as warm), fan controller 195 can selectively control fan 196 to be powered on at a moderate speed to provide moderate cooling to section 1 201. As the temperature of section 3 203 is elevated (such as hot), fan controller 195 can selectively control fan 198 to be fully powered on to provide full cooling to section 3 203. As the temperatures of sections 2 202 and 4 204 are not elevated (such as cool), fan controller 195 selectively controls fans 197 and 199 to be powered off, as cooling to sections 2 202 and 4 204 is not needed FIG. 4 shows a method 400 that begins at block 401 and continues to block 402. At block 402, temperatures of a plurality of IHS components of IHS 100 are measured. From block 402, method 400 continues to block 403. At block 403, topological information is obtained as to the locations of the IHS components of IHS 100 within IHS 100. As examples, the locations of IHS components within IHS 100 can include locations of integrated circuits (ICs) on a printed circuit board (PCB), locations of PCBs relative to other PCBs, connectors, or other IHS structures, locations of PCBs within a chassis of IHS 100, the like, or combinations thereof. From block 403, method 400 continues to block 404. At block 404, a plurality of cooling sections of the IHS are defined within the IHS with respect to the plurality of fans of the IHS. For example, the topological information as to the locations of IHS components within IHS 100 can be used to map the temperatures of the plurality of IHS components to the expected airflow patterns of the plurality of fans of the IHS. As another example, the definitions of the cooling sections can be updated based on changes to measured temperatures resulting from changes to selective control of the fans. For example, if one or more fans provide an unexpected portion of its or their airflow pattern or patterns that serve to cool an IHS component, the expected airflow pattern of those one or more fans can be updated to allow mapping of the temperature of that IHS component to the expected airflow pattern of those one or more fans. From block 404, method 400 continues to block 405. At block 405, the plurality of fans are selectively controlled according to component temperatures and the defined cooling sections. For example, one or more fans not needed to cool IHS components can be slowed down to a lower speed or turned off to save power. From block 405, method 400 continues to block 406. At block 406, selective fan operation is correlated to component temperatures. As the selective fan control of block 405 was performed according to the defined cooling sections of 404, the results of the selective fan control can be assessed by monitoring temperatures of IHS components in response to the selective fan control. Temperature reductions of IHS components that correlate to the operation of a fan can be used to revise the definitions of cooling sections in block 404, for example, iteratively as method 400 is repeated. From block 406, method 400 returns to block 402, enabling such repetition of method 400. For example, when a temperature reduction of an IHS component appears to have a causal relationship depending on the operation of a particular fan, that IHS component can be included within the cooling section pertaining to that particular fan. IHS component temperatures that remain the same or rise can be used to revise the definitions of cooling sections in block 404, for example, iteratively as method 400 is repeated. For example, when no correlation of temperature reduction is observed for an IHS component within a cooling section pertaining to a particular fan as a result of operation of that fan, that IHS component can be excluded from that cooling section. As method 400 or portions thereof are repetitively performed, the definitions of cooling sections can be adaptively refined to accurately place IHS components cooled by each particular fan within a cooling section pertaining to that particular fan. A one-to-one correspondence between the fan having the highest correlation to a particular IHS component can be established. Alternatively, for IHS components whose temperatures correlate to operation of more than one fan, a more-than-one-to-one correspondence can be established. For a more-than-one-to-one correspondence, fan operation can be controlled so as to operate the multiple relevant fans in unison, in sequence, or as may be dictated by other factors. As an example, temperatures of other IHS components within the relevant cooling sections can be evaluated, and a fan for a cooling section that would provide a collateral cooling effect to at least one other IHS component exhibiting at least some elevation of temperature can be selectively operated. As another example, as the temperature of an IHS component for which a plurality of fans exhibits a more-than-one-to-one correspondence for cooling that IHS component rises, that plurality of fans or a portion thereof can be sequentially selectively operated. As an example, sequential selective fan operation can be cumulative, with a first fan continuing to operate as one or more additional fans are turned on to provide additional cooling. If implemented using variable speed fans, the first fan can continue to operate at its existing speed or can be increased in speed as the one or more additional fans are turned on or increased in speed to provide additional cooling. As another example, sequential selective fan operation can be exclusive, with one or more fans being turned off and one or more other fans being turned on. If implemented using variable speed fans, the cooling load can be shared among multiple fans, for example, by increasing the speed of one or more fans while decreasing the speed of one or more fans. Exclusive sequential fan operation can be used to distribute the operational times of the fans among the fans to prolong their lifespans. Thus, one or more fans can be selectively controlled to provide cooling to one or more IHS components needing cooling while avoiding unnecessary power consumption and mechanical wear of fans.

An IHS, such as IHS 100, for example, a server, can have multiple fan slots and fans can be placed into available slots as may be desired. The number of slots is typically fixed, but it is not mandatory that all the slots be populated with fans. However, historically it has been a challenge to determine which components in a server heat up and over which time periods, as such effects may be dependent upon numerous factors. Because of such difficulty, fans have typically been installed in all of the available slots of the server. Overuse of fans can waste electricity and result in unnecessary wear of moving parts of the fans. Thus, it would be advantageous to be able to switch off (or slow down) specific fans that are not required at a particular moment and to switch on (or speed up) fans that are actually needed.

To identify components that would benefit from cooling air provided by specific fans, the temperature of each of a plurality of diversely located components is measured. As an example, the temperature of each of a plurality of integrated circuits (ICs) on a printed circuit board (PCB) can be measured. System information, including, for example, the measured temperatures, can be collected using system management software executed by a processor of the IHS. This system information can be collected periodically, manually, or can be event-based. For example, the temperature of each component can be collected either periodically or based on an event. An increase in temperature values can raise an event, which can signal software, such as the system management software. The identity of the IHS or its constituent components can be obtained to facilitate the inquiries as to the temperatures of the components in the IHS. Spatial information as to the layout of the components within the IHS (such as within a PCB, among PCBs, etc.) can be obtained based on the identity information.

In accordance with at least one embodiment, a temperature value of a component of an IHS is compared with a threshold temperature value. System management software can be configured to define spatial regions over an area of the IHS (such as over an area of one or more PCBs of the IHS). The division into spatial regions can be based on locations of fan slots, airflow of fans in those fan slots, etc. The spatial regions can be referred to as sections.

If a component spans a plurality of sections, either physically or according to virtual designations into spatial regions, then the temperature of that component is considered in all of the sections into which that component is included. For example, if Component F is shared by Section 3 and Section 4, and if x is the temperature of Component F, then x will be included in determining both the Section 3 temperature value and the Section 4 temperature value. As an example, the temperature value of a section can be determined based on the maximum component temperature within that section, the mean component temperature within that section, the median component temperature within that section, the like, or a combination thereof. The temperature value of each section is compared with the already stored threshold value of the identified IHS.

Based on the comparison report, the sections can be categorized depending upon the drift they have from the threshold. As an example, a trend toward a more optimal state can be indicated by a positive drift value, and a trend toward a less optimal state can be indicated by a negative drift value. Thus, the elevation of a temperature within a section can result in a negative drift value. For example, if Section 3 has a negative drift value of 25% and Section 1 has a negative drift value of 15%, then Section 3 can be placed in one category while Section 1 is placed in another category. As an example, the categorization can be presented using color coding. In the above example, Section 3 can be marked, for example, with a darker red color, and Section 1 can be marked, for example, with a lighter one.

In accordance with at least one embodiment, if the calculated temperature value is greater than or equal to the threshold temperature value, then an alert is generated and the section is categorized accordingly (such as colored red). The system management software will then switch on the fans of the sections which have a higher negative drift value. According to the above example, Section 3 is switched on first and Section 1 is switched on next.

Similarly, based on the same calculations, if the fans are already switched on and if they are not required, then the fans are switched off. Because of the good health status of the sections in which the fans are not required, it is not necessary to indicate the switching off of the unneeded fans on the color-coded image.

In an implementation using variable speed fans, the increase of fan speed and the decrease of fan speed can be performed instead of or in addition to the switching on and switching off, respectively, of the fans described above. For example, the fan speed can be determined as a function of section temperature, which is determined as a function of temperatures of components within each section.

In accordance with at least one embodiment, automatic configuration of fan operation responsive to temperatures of components within an IHS is provided in real time. Thus, one or more fans can be operated to cool one or more components needing cooling at any point in time, while one or more other fans can be kept in an inoperative state for components not needing cooling at that point in time. In accordance with at least one embodiment, IHS component temperature information can be collected from IHS components and managed in a centralized manner under control of system management software.

In accordance with at least one embodiment, a method comprises measuring component temperatures of each of a plurality of information handling system (IHS) components in an IHS; obtaining topological information as to locations of the IHS components within the IHS; defining, by a fan controller of the IHS, cooling sections within the IHS with respect to a plurality of fans of the IHS; and selectively controlling, by the fan controller, the plurality of fans according to the component temperatures and the cooling sections. In accordance with at least one embodiment, the method further comprises correlating selective fan operation to the component temperatures. In accordance with at least one embodiment, the method is performed iteratively to refine cooling section definitions based on correlations of the selective fan operation to the component temperatures. In accordance with at least one embodiment, the defining the cooling section within the IHS comprises defining the cooling sections according to the topological information. In accordance with at least one embodiment, a single IHS component of the plurality of IHS components is defined to be within more than one of the cooling sections. In accordance with at least one embodiment, the defining the cooling sections comprises defining the cooling sections to have a one-to-one correspondence between a fan and a cooling section. In accordance with at least one embodiment, selectively controlling the plurality of fans further comprises evaluating an aggregate temperature of a cooling section based on section component temperatures of section IHS components included within a definition of the cooling section; and selectively controlling a fan according to the aggregate temperature of the cooling section, wherein the cooling sections comprise the cooling section, the component temperatures comprise the section component temperatures, the IHS component comprise the section IHS components, and the plurality of fans comprise the fan.

In accordance with at least one embodiment, an information handling system (IHS) comprises a plurality of spatially diverse IHS components; a plurality of temperature sensors disposed with respect to the plurality of spatially diverse IHS components; a plurality of spatially diverse fans; a fan controller coupled to the plurality of temperature sensors and to the plurality of spatially diverse fans, the fan controller configured to define cooling sections of the IHS for the plurality of spatially diverse fans based on topological information as to locations of the plurality of spatially diverse IHS components within the IHS and to selectively control the plurality of spatially diverse fans according to component temperatures obtained from the plurality of temperature sensors and according to the cooling sections. In accordance with at least one embodiment, the fan controller is further configured to correlate selective fan operation to the component temperatures. In accordance with at least one embodiment, the fan controller is further configured to refine cooling section definitions based on correlations of the selective fan operation to the component temperatures. In accordance with at least one embodiment, a single IHS component of the plurality of spatially diverse IHS components is defined to be within more than one of the cooling sections. In accordance with at least one embodiment, the cooling sections are defined to have a one-to-one correspondence between a fan of the plurality of spatially diverse fans and a cooling section of the cooling sections. In accordance with at least one embodiment, the fan controller is configured to evaluate an aggregate temperature of a cooling section based on section component temperatures of section IHS components included within a definition of the cooling section and to selectively control a fan according to the aggregate temperature of the cooling section, wherein the cooling sections comprise the cooling section, the component temperatures comprise the section component temperatures, the plurality of spatially diverse IHS components comprise the section IHS components, and the plurality of spatially diverse fans comprise the fan.

In accordance with at least one embodiment, a method comprises measuring component temperatures of each of a plurality of information handling system (IHS) components in an IHS; defining, by a fan controller of the IHS, cooling sections within the IHS with respect to expected airflow patterns of a plurality of fans of the IHS; and selectively controlling, by the fan controller, the plurality of fans according to the component temperatures and the cooling sections. In accordance with at least one embodiment, the method further comprises obtaining topological information as to locations of the IHS components within the IHS. In accordance with at least one embodiment, the method further comprises correlating selective fan operation to the component temperatures. In accordance with at least one embodiment, the method is performed iteratively to refine cooling section definitions based on correlations of the selective fan operation to the component temperatures. In accordance with at least one embodiment, the defining the cooling section within the IHS comprises defining the cooling sections according to the topological information. In accordance with at least one embodiment, a single IHS component of the plurality of IHS components is defined to be within more than one of the cooling sections. In accordance with at least one embodiment, selectively controlling the plurality of fans further comprises evaluating an aggregate temperature of a cooling section based on section component temperatures of section IHS components included within a definition of the cooling section; and selectively controlling a fan according to the aggregate temperature of the cooling section, wherein the cooling sections comprise the cooling section, the component temperatures comprise the section component temperatures, the IHS component comprise the section IHS components, and the plurality of fans comprise the fan.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, the information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. Information handling systems can also include one or more buses operable to transmit information between the various hardware components.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method comprising:
measuring component temperatures of each of a plurality of information handling system (IHS) components in an IHS;
obtaining topological information as to locations of the IHS components within the IHS;
defining, by a fan controller of the IHS, cooling sections within the IHS with respect to a plurality of fans of the IHS;
selectively controlling, by the fan controller, the fans according to the component temperatures and the cooling sections, wherein, when the component temperatures of a particular cooling section are below a particular temperature, controlling the fans includes turning off a particular fan associated with the particular cooling section;
re-measuring the component temperatures of each of the IHS components; and
redefining, by the fan controller, the cooling sections within the IHS with respect to the fans based upon the re-measured component temperatures.

2. The method of claim 1 further comprising:
correlating selective fan operation to the component temperatures.

3. The method of claim 2, wherein the method is performed iteratively to refine cooling section definitions based on correlations of the selective fan operation to the component temperatures.

4. The method of claim 1, wherein the defining the cooling section within the IHS comprises:
defining the cooling sections according to the topological information.

5. The method of claim 1, wherein a single IHS component of the plurality of IHS components is defined to be within more than one of the cooling sections.

6. The method of claim 1, wherein the defining the cooling sections comprises:
defining the cooling sections to have a one-to-one correspondence between a fan and a cooling section.

7. The method of claim 1 wherein selectively controlling the plurality of fans further comprises:
evaluating an aggregate temperature of a cooling section based on section component temperatures of section IHS components included within a definition of the cooling section; and
selectively controlling a fan according to the aggregate temperature of the cooling section, wherein the cooling sections comprise the cooling section, the component temperatures comprise the section component temperatures, the IHS component comprise the section IHS components, and the plurality of fans comprise the fan.

8. An information handling system (IHS) comprising:
a plurality of spatially diverse IHS components;
a plurality of temperature sensors disposed with respect to the spatially diverse IHS components;
a plurality of spatially diverse fans;
a fan controller coupled to the temperature sensors and to the spatially diverse fans, the fan controller configured to measure the temperatures of the components, to define cooling sections of the IHS for the spatially diverse fans based on topological information as to locations of the spatially diverse IHS components within the IHS and based upon the component temperatures, to selectively control the spatially diverse fans according to component temperatures obtained from the temperature sensors and according to the cooling sections, to re-measure the temperatures of the components, and to redefine the cooling sections of the IHS based upon the re-measured component temperatures, wherein, when the component temperatures of a particular cooling section are below a particular temperature, controlling the fans includes turning off a particular fan associated with the particular cooling section.

9. The IHS of claim 8, wherein the fan controller is further configured to correlate selective fan operation to the component temperatures.

10. The IHS of claim 9, wherein the fan controller is further configured to refine cooling section definitions based on correlations of the selective fan operation to the component temperatures.

11. The IHS of claim 8, wherein a single IHS component of the plurality of spatially diverse IHS components is defined to be within more than one of the cooling sections.

12. The IHS of claim 8, wherein the cooling sections are defined to have a one-to-one correspondence between a fan of the plurality of spatially diverse fans and a cooling section of the cooling sections.

13. The IHS of claim 8, wherein the fan controller is configured to evaluate an aggregate temperature of a cooling section based on section component temperatures of section IHS components included within a definition of the cooling section and to selectively control a fan according to the aggregate temperature of the cooling section, wherein the cooling sections comprise the cooling section, the component temperatures comprise the section component temperatures, the plurality of spatially diverse IHS components comprise the section IHS components, and the plurality of spatially diverse fans comprise the fan.

14. A method comprising:
measuring component temperatures of each of a plurality of information handling system (IHS) components in an IHS;
defining, by a fan controller of the IHS, cooling sections within the IHS with respect to expected airflow patterns of a plurality of fans of the IHS;
selectively controlling, by the fan controller, the fans according to the component temperatures and the cooling sections, wherein, when the component temperatures of a particular cooling section are below a particular temperature, controlling the fans includes turning off a particular fan associated with the particular cooling section
re-measuring the component temperatures of each of the IHS components; and
redefining, by the fan controller, the cooling sections within the IHS with respect to the fans based upon the re-measured component temperatures.

15. The method of claim 14 further comprising:
  correlating selective fan operation to the component temperatures.

16. The method of claim 15, wherein the method is performed iteratively to refine cooling section definitions based on correlations of the selective fan operation to the component temperatures.

17. The method of claim 14, wherein the defining the cooling section within the IHS comprises:
  defining the cooling sections according to the topological information.

18. The method of claim 14, wherein a single IHS component of the plurality of IHS components is defined to be within more than one of the cooling sections.

19. The method of claim 14, wherein selectively controlling the fans further comprises:
  evaluating an aggregate temperature of a cooling section based on section component temperatures of section IHS components included within a definition of the cooling section; and
  selectively controlling a fan according to the aggregate temperature of the cooling section, wherein the cooling sections comprise the cooling section, the component temperatures comprise the section component temperatures, the IHS component comprise the section IHS components, and the plurality of fans comprise the fan.

* * * * *